(12) United States Patent
Chang et al.

(10) Patent No.: US 8,242,608 B2
(45) Date of Patent: Aug. 14, 2012

(54) UNIVERSAL BUMP ARRAY STRUCTURE

(75) Inventors: Li-Tien Chang, Taipei (TW); Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 826 days.

(21) Appl. No.: 12/242,674

(22) Filed: Sep. 30, 2008

(65) Prior Publication Data

US 2010/0078207 A1    Apr. 1, 2010

(51) Int. Cl.
*H01L 23/48*    (2006.01)
(52) U.S. Cl. ........ 257/778; 257/737; 257/697; 257/691; 257/E23.06; 257/E23.079
(58) Field of Classification Search .................. 257/685, 257/686, 723, 726, E25.031–E25.032, E23.042
See application file for complete search history.

(56) References Cited

U.S. PATENT DOCUMENTS

| | | | |
|---|---|---|---|
| 6,225,702 B1 * | 5/2001 | Nakamura | 257/786 |
| 6,907,658 B2 * | 6/2005 | Li | 29/832 |
| 7,791,192 B1 * | 9/2010 | Joshi et al. | 257/724 |
| 2001/0013654 A1 * | 8/2001 | Kalidas et al. | 257/738 |
| 2007/0064375 A1 * | 3/2007 | Urashima et al. | 361/311 |

\* cited by examiner

Primary Examiner — Mamadou Diallo
(74) Attorney, Agent, or Firm — Womble Carlyle Sandridge & Rice LLP

(57) ABSTRACT

A bump array structure for an integrated circuit is presented. An array of metal alloy bumps is disposed on a surface of the integrated circuit. The array of metal alloy bumps is configured to receive input from a multi-layer substrate package and transmit output to the multi-layer substrate package. The array defines a first portion of metal alloy bumps around the periphery of the surface of the integrated circuit configured to provide power and ground signals for the integrated circuit. The array further defines a second portion of metal alloy bumps providing power and ground for the integrated circuit, located between opposing sides of the periphery of the integrated circuit. Metal alloy bumps not contained in either the first or the second portion of the array are configured for input and output signals between the integrated circuit and the multi-level substrate package.

20 Claims, 5 Drawing Sheets

UNIVERSAL BUMP ARRAY STRUCTURE

BACKGROUND OF THE INVENTION

The use of bump array structures is popular in applications that require low signal loss at high frequency or require a high number of input/output (I/O) pin-outs. A variety of multi-layer substrate packages are typically used with bump array structures. Typically the multi-layer substrate packages can be classified as either high cost and high performance or low cost and low performance. Low performance packages are typically composed of a few conductive layers and route I/O traces directly on top layer of the circuitry as micro-strip line to reduce the number of layers needed for the design. In contrast, high performance packages typically require strip line routing due to density and signal integrity reasons and further require on package decoupling (OPD). On package decoupling requires a ground and/or power line placed on the top layers of the multi-layer substrate package before I/O traces are routed.

Due to the differing locations of the power and ground plane in different types of multi-layer substrate packages, the bump array configuration can typically be optimized for either the high performance package or the low performance package. The typical configuration of the bump array has power and ground net bumps providing a power and ground circuit to the integrated circuit at the periphery of the bump array. For high performance multi-layer substrate packages, the power and ground bumps are usually located in the outer most row of the bump array, which connects to the power and ground plane placed at the two topmost layers of the package to maximize the efficiency of the OPD capacitor. Low performance multi-layer substrate packages typically have a reduced layer count on the packaging substrate compared to a high performance package and do not have OPD. When configuring the bump array structure, the I/O traces fan-out starting from top layer of the multi-layer substrate package to the lower conductive layers of the multi-layer substrate package, such that the bumps supplying power and ground to the integrated circuit are lower priority and are typically routed after the I/O signal layers. In other cases, the low performance multi-layer substrate may not have dedicated layers for power and ground.

To resolve the difficulties satisfying both high end and low end product routing requirements of differing bump array packages implemented with or without OPD capacitors, as well as to be able to route I/O and the power/ground net in different configurations, there is a need to solve the problems of the prior art to provide a method and apparatus for flexible input and output routing using a universal bump array structure.

SUMMARY OF THE INVENTION

Broadly speaking, the present invention fills these needs by providing a method and apparatus for flexible signal routing utilizing a so called universal bump array structure.

In accordance with one aspect of the invention, a bump array structure for an integrated circuit is provided. An array of metal alloy bumps is disposed on a surface of the integrated circuit. The array of metal alloy bumps is configured to receive input from a multi-layer substrate package and transmit output to the multi-layer substrate package. The array defines a first portion of metal alloy bumps around the periphery of the surface of the integrated circuit configured to provide power and ground signals for the integrated circuit. In addition, a second portion of metal alloy bumps providing power and ground is defined between opposing sides of the periphery of the integrated circuit. Metal alloy bumps disposed between the first portion and the second portion of the bump array structure are configured to receive input signals and transmit output signals between the integrated circuit and the multi-layer substrate package.

In accordance with another aspect of the invention, a multi-layer substrate package for an integrated circuit that accommodates alternative locations of power/ground metal alloy bumps is detailed. The multi-layer substrate package includes a plurality of conducting pads arranged on a surface. A first portion of the plurality of conducting pads is configured to transmit input signals and receive output signals from the integrated circuit. A second portion of conducting pads is configured to provide power and ground signals and is selectively positioned to couple with metal alloy bumps providing power and ground signals to the integrated circuit. Each conducting pad on the surface of the multi-layer substrate package is coupled to a conductive layer of the multi-layer substrate package.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The following embodiments describe an apparatus and method for flexible input and output routing using a universal bump array structure. It will be obvious, however, to one skilled in the art, that the present invention may be practiced without some or all of these specific details. In other instances, well known process operations have not been described in detail in order not to unnecessarily obscure the present invention.

A universal bump array structure that allows routing of power and ground from either from the periphery or the interior of the bump array structure can be used for a variety of multi layer substrate packages. The power and ground portion at the periphery of the bump array structure can couple to the power and ground plane on the top surface of a high performance multi-layer substrate package. For a low performance multi-layer substrate package with a power and ground plane contained in a conductive layer below the top surface, the power and ground portion at the periphery of the bump array structure can be left floating. At the same time, the power and ground portion within the interior of the same bump array structure can be used to couple to the ground plane contained in a conductive layer below the top surface, without impeding the routing of input and output signals in the conductive layers closer to the top surface of the multi-layer substrate package.

Figure 1:
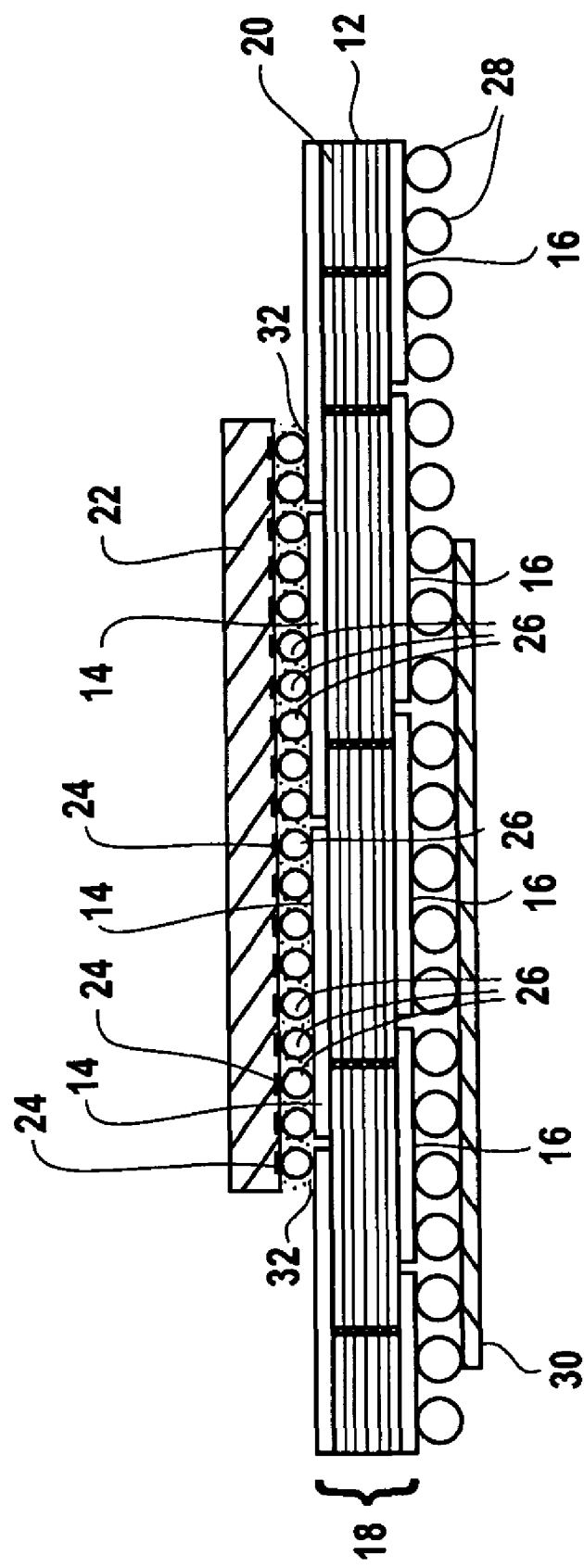
FIG. 1 illustrates a cross section of a multi-layer substrate package for an integrated circuit that accommodates alternative locations of power/ground metal alloy bumps in accordance with one embodiment of the present invention.

FIG. 1 illustrates a cross section of a multi-layer substrate package for an integrated circuit that accommodates alternative locations of power/ground metal alloy bumps in accordance with one embodiment of the present invention. The multi layer substrate package 18 is configured with a plurality of conductive layers 20 sandwiched between layers of dielectric material 12. The multi-layer substrate package 18 accommodates an integrated circuit 22 utilizing a plurality of contact pads 24 and a plurality of metal alloy bumps 26 configured in a universal bump array. A plurality of conducting pads 32 is disposed on the surface 14 of the multi-layer substrate package 18 opposite the surface of the integrated circuit 22 containing the array of metal alloy bumps 26. A plurality of bond pads 16 is disposed on the surface 14 of the multi-layer substrate package 18 opposite the surface of the multi-layer substrate package 18 containing the plurality of conducting pads 32. Coupled to the bond pads 16 of the multi-layer substrate package 18 is a plurality of metal alloy bumps 28. The plurality of metal alloy bumps 28 couples the multi-layer substrate package 18 to a printed circuit board 30.

The plurality of conducting pads 32 of the multi-layer substrate package 18 in conjunction with the array of metal alloy bumps 26 coupled to the contact pads 24 of the integrated circuit provide electrical communication between the multi-layer substrate package 18 and the integrated circuit 22. Each of the plurality of conducting pads 32 on the surface 14 of the multi layer-substrate package 18 is coupled to a corresponding conductive layer 20 of the multi-layer substrate package 18. A first portion of the plurality of conducting pads 32 transmits input signals and receives output signals from the integrated circuit 22. A second portion of the plurality of conducting pads 32 providing power and ground are selectively positioned to couple with metal alloy bumps 26 providing power and ground signals to the integrated circuit 22.

In one embodiment, the multi-layer substrate package 18 is configured to mate with an integrated circuit 22 that accommodates alternative locations of power/ground metal alloy bumps 26. The multi-layer substrate package 18 supports an integrated circuit 22 having an array of metal alloy bumps 26 configured with an outer periphery and an inner portion for accepting a power and ground plane. The inner portion of the array of metal alloy bumps 26 is surrounded by the outer periphery of metal alloy bumps 26. The multi-layer substrate package 18 is configured to allow flexibility to selectively position conducting pads providing power/ground to the integrated circuit 22 based on the routing needs of the input and output signals.

In another embodiment, the plurality of conducting pads 16 of the multi-layer substrate package 18 providing power and ground signals is configured to support a universal bump array allowing input and output signals to escape in at least four directions. The multi-layer substrate package 18 removes power/ground signals by not providing conducting pads 32 to a selected subset of the outer periphery portion of metal alloy bumps 26 of the integrated circuit 22. Instead, the selected subset of metal alloy bumps 26 of the outer periphery are allowed to float, which enables the second portion of conducting pads 32 access to inner portion of metal alloy bumps 26 providing power and ground to the integrated circuit 22 through a particular side.

Figure 2:
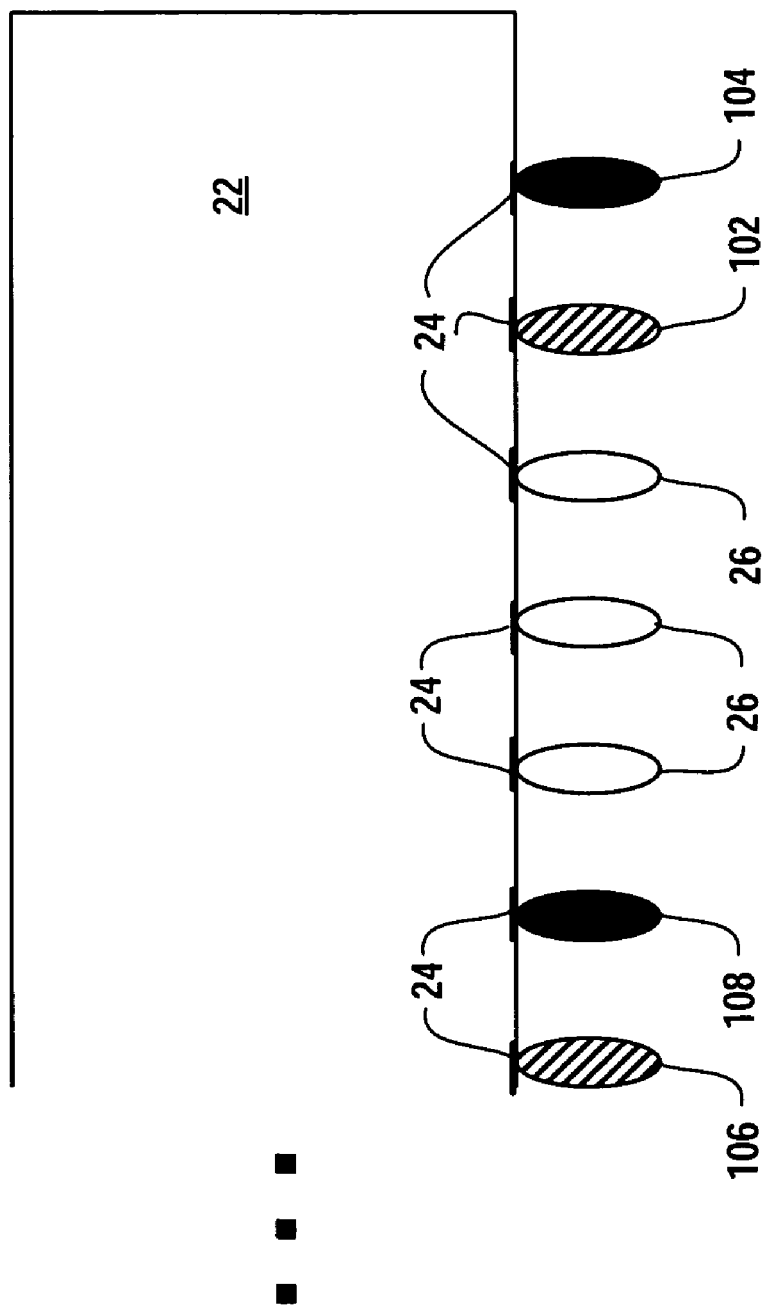
FIG. 2 illustrates a cross-section of a universal bump array structure on an integrated circuit in accordance with one embodiment of the present invention.

FIG. 2 illustrates a cross-section of a universal bump array structure of an integrated circuit in accordance with one embodiment of the present invention. The bump array structure consists of an array of metal alloy bumps 26, disposed on a surface of the integrated circuit 22. In one embodiment, a first portion of metal alloy bumps configured to receive power 102 and ground 104 from the multi-layer substrate package is defined at the periphery of the integrated circuit 22. In addition, a second portion of metal alloy bumps configured to receive power 106 and ground 108 from the multi-layer substrate package is located between opposing sides of the periphery of the integrated circuit 22. Furthermore, metal alloy bumps 26 not included in either the first portion or the second portion of the bump array structure receive input and transmit output signals between the multi-layer substrate package and the integrated circuit 22. The metal alloy bumps 26 configured for receiving input or transmitting output are coupled to a corresponding input/output conductive layer located below the surface of the multi-layer substrate package.

Figure 3:
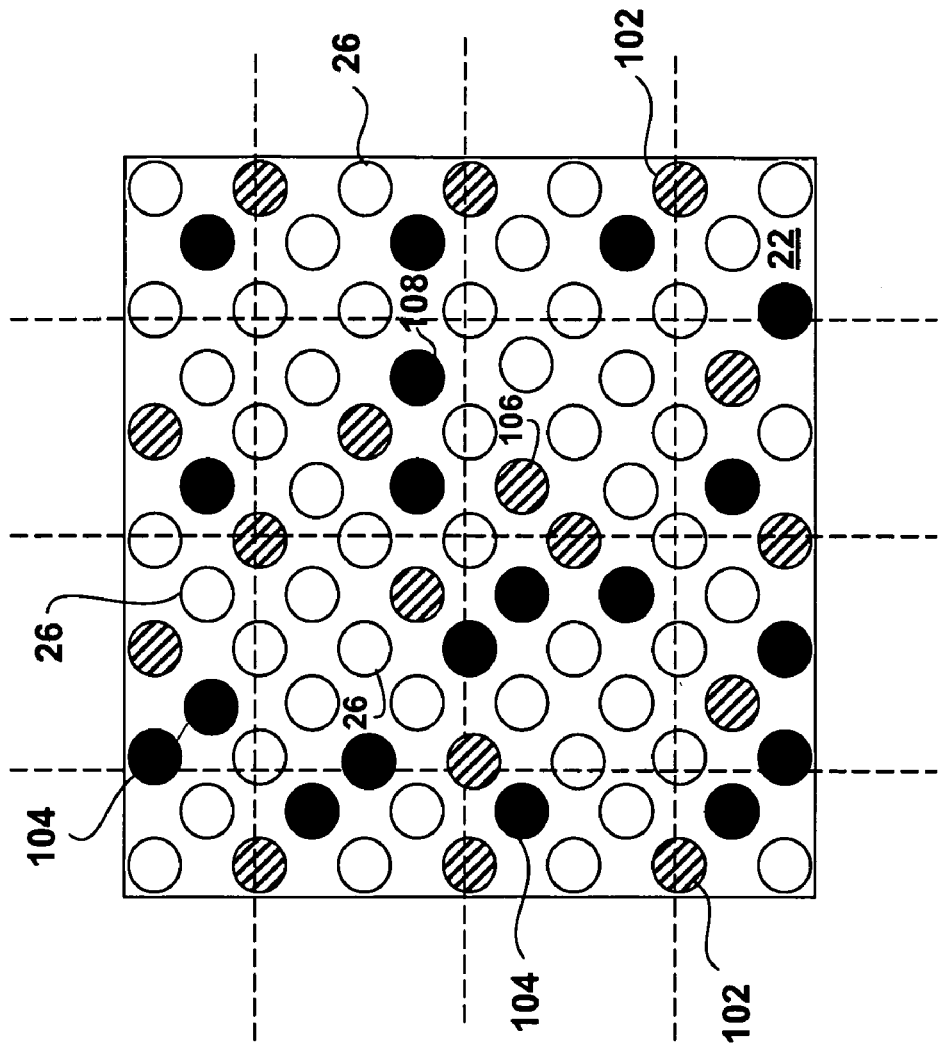
FIG. 3 illustrates a bottom view of the universal bump array in accordance with one embodiment of the present invention.

FIG. 3 illustrates a bottom view of the universal bump array in accordance with one embodiment of the present invention. When the power and ground plane of the multi-layer substrate package is located on the surface, the metal alloy bumps 102 and 104 within the first portion of metal alloy bumps, defined at the periphery of the bump array structure, are coupled to conducting pads on the surface of the multi-layer substrate package. In one embodiment, the conducting pads of the multi-layer substrate package are configured to mate with the second portion of metal alloy bumps providing power and ground to the integrated circuit 22, when the power/ground plane is located in a conductive layer below the surface of the multi-layer substrate package. In another embodiment, the second portion of metal alloy bumps is patterned as an intersecting row and column.

Figure 4:
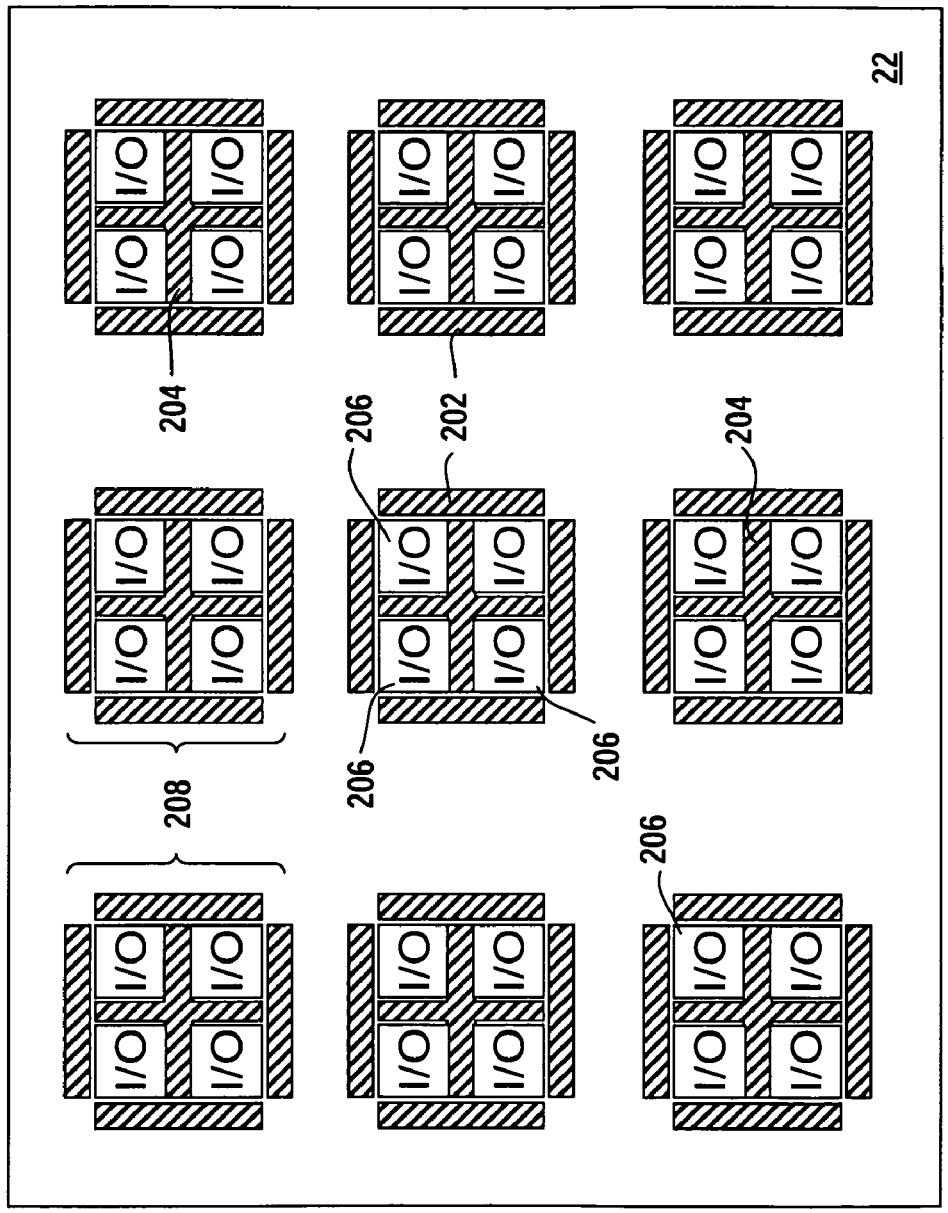
FIG. 4 illustrates a bottom view of universal bump array configured in a plurality of subarrays on a surface of an integrated circuit in accordance with one embodiment of the present invention.

FIG. 4 illustrates a bottom view of universal bump array configured in a plurality of subarrays on a surface of an integrated circuit in accordance with one embodiment of the present invention. Each subarray 208 consists of metal alloy bumps disposed on a surface of the integrated circuit 22, as illustrated in FIG. 3. For clarity, the metal bumps configured to receive power and ground are represented in regions 202 and 204 of the bump array structure. In addition, the metal alloy bumps configured to receive inputs and transmit output signals between the integrated circuit 22 and the multi-layer substrate package are represented as a region 206 of the bump array structure.

Each subarray 208 is patterned with an outer peripheral portion 202 of metal alloy bumps surrounding an inner portion 204 of metal alloy bumps, where the inner portion 204 extends between each opposing side of the outer peripheral portion 202. The outer peripheral portion 202 and the inner portion 204 providing power and ground signals for the integrated circuit 22. Configuring the bump array structure in a plurality of subarrays 208 for an integrated circuit 22 allows input/output routing in multiple directions.

In one embodiment, each subarray 208 is configured to mate with the conducting pads of a multi-layer substrate package. Within the outer peripheral portion 204 of the subarray 208, the metal alloy bumps providing power and ground signals to the integrated circuit 22 can be coupled to conducting pads on the surface of the multi-layer substrate package if the power/ground plane is located oil the surface of the multi-layer substrate package. The metal alloy bumps within the inner portion 204 of the subarray 208, providing power and ground to the integrated circuit can be coupled to a power/ground plane located in a conductive layer located below the surface of the multi-layer substrate package. Metal alloy bumps of each subarray 208 not contained in either the outer peripheral portion 202 or the inner portion 204 of the subarray 208 receive input and transmit output between the integrated circuit 22 and the multi-layer substrate package. The metal alloy bumps for input/output 206 routing are coupled to an input/output plane located in a conductive layer located below the surface of the multi-layer substrate package.

In another embodiment, subarrays 208 of the bump array structure can be treated as a module and be repeatedly copied along the peripheral direction or through the center of integrated circuit, thus populating the surface of the integrated circuit with subarrays 208.

Figure 5:
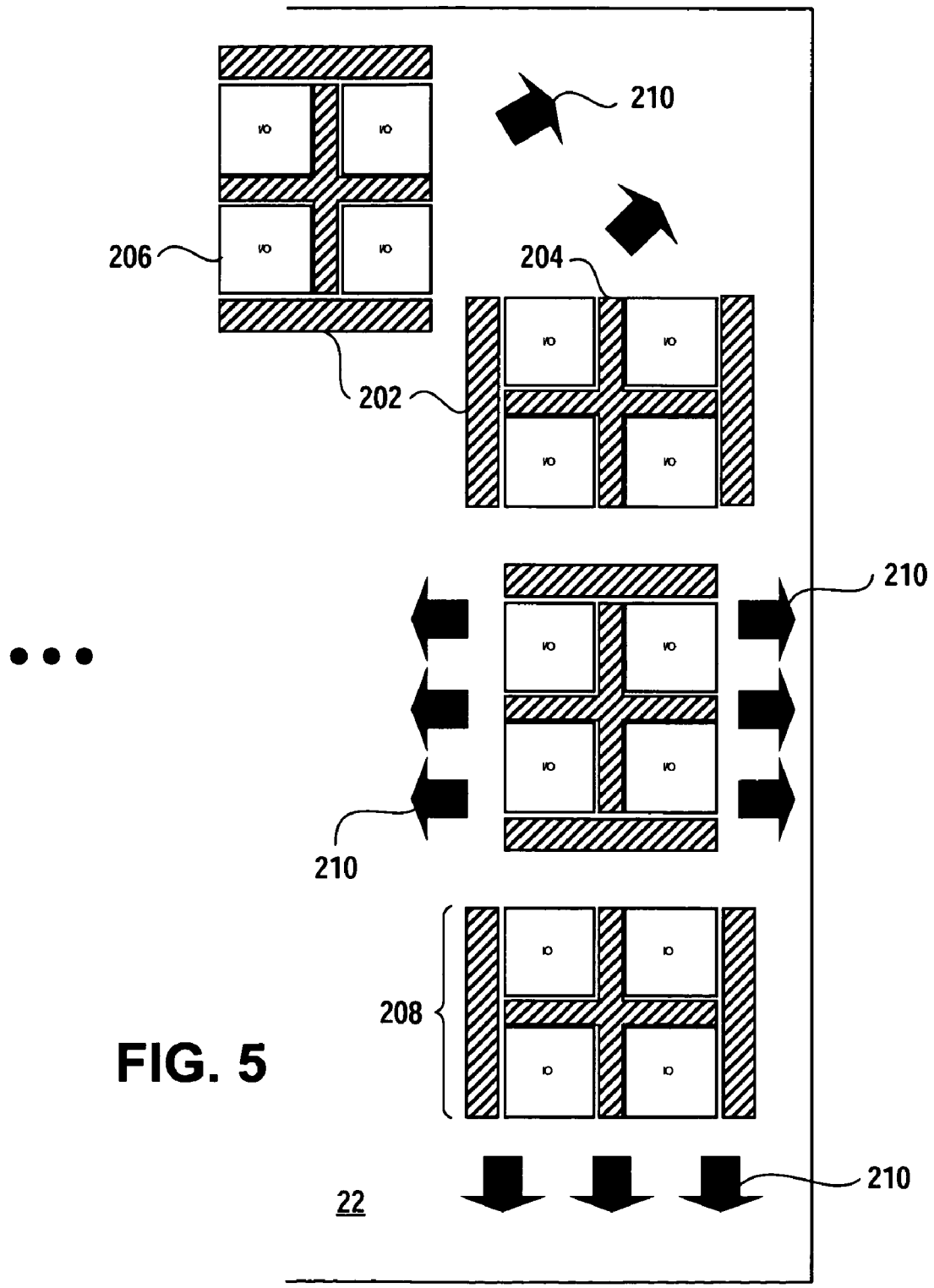
FIG. 5 illustrates multi-directional input and output signal routing capabilities offered through a universal bump array structure in accordance with one embodiment of the present invention.

FIG. 5 illustrates multi-directional input and output signal routing capabilities offered through a universal bump array structure in accordance with one embodiment of the present invention. As illustrated in FIG. 4, each subarray 208 of the universal bump array structure is defined with an outer periphery portion 202 and an inner portion 204 configured to receive power and ground from the multi layer substrate package. Metal alloy bumps not part of the outer periphery portion 202 or the inner portion 204 are configured for input and output signals between the integrated circuit 22 and the multi-layer substrate package. Direction of input and output routing is represented by arrows 210.

In one embodiment, the bump array structure configured in subarrays 208 enables input and output signal routing from any of four sides of an integrated circuit 22. The inner portion 204 configured to transmit power and ground on a side of the integrated circuit 22 can be selectively coupled to conducting pads of the multi-layer substrate package configured to transmit power and ground. By selectively coupling the inner portion 204 of the subarray 208 of metal alloy bumps to a conductive power and ground layer below the surface of the multi-layer substrate package, input or output signals can be routed through a side of the integrated circuit 22 without being impeded by the power and ground routing. Alternatively, on the side of the integrated circuit 22 not used for routing input or output signals, the outer periphery portion 202 of the subarrays 208 of metal alloy bumps configured for power and ground signals can be coupled to conducting pads on the surface of the multi-layer substrate package.

In another embodiment, one or more subarrays 208 positioned at a corner of the integrated circuit 22 enables routing of input and output signals 210 diagonally from the corner of the integrated circuit 22 through selective coupling to the metal alloy bumps of the inner portion 204 of the subarray 208. By selectively coupling the inner portion 204 along the side of the subarray 208 with input and output signal routing 210, input or output signals can be routed 210 through a corner of the integrated circuit 22 without being impeded by the power and ground routing.

While the embodiments, thus far, are described with respect to an integrated circuit, the method and apparatus described herein may be incorporated into any suitable circuit, including microprocessors, application-specific integrated circuits, or programmable logic devices.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A universal bump array structure for an integrated circuit comprising:
an array of metal alloy bumps disposed on a surface of the integrated circuit, the array of metal alloy bumps configured to receive input from a multi-layer substrate package and transmit output to the multi-layer substrate package, wherein the array includes a first portion of metal alloy bumps that provide power and ground signals for the integrated circuit, the first portion defined around a periphery of the surface of the integrated circuit, and a second portion of metal alloy bumps that provide power and ground for the integrated circuit, the second portion located between opposing sides of the periphery of the surface of the integrated circuit, wherein the second portion of metal alloy bumps is patterned in an intersecting row and column format.

2. The bump array structure of claim 1 further configured to mate with conducting pads of the multi-layer substrate package, wherein within the first portion of metal alloy bumps providing power and ground to the integrated circuit, one or more metal alloy bumps are coupled to conducting pads on the surface of the multi-layer substrate package when a power/ground plane of the multi layer substrate package is located on a top surface of the multi-layer substrate package opposite the surface of the integrated circuit containing the bump array structure.

3. The bump array structure of claim 1 further configured to mate with conducting pads of the multi-layer substrate package, wherein within the second portion of metal alloy bumps providing power and ground to the integrated circuit, one or more metal alloy bumps are coupled to a power/ground plane located in a conductive layer located below a top surface of the multi-layer substrate package.

4. The bump array structure of claim 1, wherein metal alloy bumps disposed between the first portion and the second portion of the bump array structure receive input signals from the multi-layer substrate package and transmit output signals to the multi-layer substrate package, and one or more metal alloy bumps are coupled to a input/output plane in a conductive layer located below a top surface of the multi-layer substrate package.

5. The bump array structure of claim 1, wherein input and output signal routing from sides of an integrated circuit is enabled through selectively coupling to the second portion of metal alloy bumps, and the second portion of metal alloy bumps coupled to a power and ground plane in a conductive layer located below a top surface of the multi-layer substrate package.

6. The bump array structure of claim 1, wherein power and ground routing from any sides of the integrated circuit not used for routing input or output signals is enabled through the first portion of metal alloy bumps coupling to a power and ground plane located on a top surface of the multi-layer substrate package.

7. The bump array structure of claim 1, wherein the bump array structure comprises a ball and grid.

8. A multi-layer substrate package for an integrated circuit that accommodates alternative locations of power/ground metal alloy bumps comprising:
a plurality of conducting pads arranged on a top surface of the multi-layer substrate package;
a first portion of the plurality of conducting pads transmitting input signals and receiving output signals from the integrated circuit;
a second portion of the plurality of conducting pads providing power and ground signals selectively positioned to couple with metal alloy bumps providing power and ground signals to the integrated circuit, the second portion of the plurality of conducting pads supports both an integrated circuit having an outer periphery of metal alloy bumps operable to couple to the power and ground signals and an integrated circuit having an inner portion of metal alloy bumps operable to couple to the power and ground signals, the inner portion of metal alloy bumps configured in an intersecting row and column pattern; and each of the plurality of conducting pads on the top surface of the multi-layer substrate package coupled to a conductive layer of the multi-layer substrate package.

9. The multi-layer substrate package of claim 8, wherein the top surface of the multi-layer substrate package is mated with an integrated circuit through an array of metal alloy bumps.

10. The multi-layer substrate package of claim 8, wherein the plurality of conducting pads providing the power and ground signals support at least four directions of signal escape.

11. The multi-layer substrate package of claim 8, further configured to mate with metal alloy bumps of an integrated circuit allowing flexibility to remove any power/ground interconnections on a particular side of the integrated circuit, by not providing conducting pads to a selected subset of the outer periphery of metal alloy bumps, but enabling the second portion of conducting pads access to the inner portion of metal alloy bumps providing the power and ground signals to the integrated circuit through a particular side.

12. The multi-layer substrate package of claim 8, wherein the multi-layer substrate package is a ball grid array package.

13. A bump array structure for an integrated circuit allowing input/output routing in multiple directions comprising:

an array of metal alloy bumps disposed on a surface of the integrated circuit, the array of metal alloy bumps composed of a plurality of subarrays of metal alloy bumps, each of the plurality of subarrays patterned with an outer peripheral portion of metal alloy bumps surrounding an inner portion of metal alloy bumps, the inner portion extending between each opposing side of the outer peripheral portion, the outer peripheral portion and the inner portion providing power and ground signals for the integrated circuit, wherein the inner portion of metal alloy bumps are configured in an intersecting row and column pattern.

14. The bump array structure of claim 13, wherein each subarray is further configured to mate with conducting pads of a surface of a multi layer substrate package, wherein within the outer peripheral portion of each of the plurality of subarrays, one or more metal alloy bumps providing power and ground signals to the integrated circuit is coupled to conducting pads on the surface of the multi-layer substrate package when the power/ground plane of the multi-layer substrate package is located on the surface of the multi-layer substrate package opposite the surface of the integrated circuit containing the bump array structure.

15. The bump array structure of claim 14, wherein each of the plurality of subarrays is further configured to mate with contact pads of a multi-layer substrate package, wherein within the inner portion of each of the plurality of subarrays, one or more of metal alloy bumps providing power and ground to the integrated circuit is coupled to a power/ground plane located in a conductive layer located below the surface of the multi-layer substrate package.

16. The bump array structure of claim 15, wherein metal alloy bumps of each of the plurality of subarrays not contained in the outer peripheral portion or the inner portion receive input from a multi layer substrate package and transmit output to the multi-layer substrate package, and one or more of the metal alloy bumps for receiving input and transmitting output are coupled to a corresponding input/output plane located in the conductive layer located below the surface of the multi-layer substrate package.

17. The bump array structure of claim 16, wherein one or more subarrays of the plurality of subarrays positioned at a corner of the integrated circuit enables routing of input and output signals diagonally from the corner through selective coupling to the metal alloy bumps of the inner portion of the one or more subarrays of the plurality of subarrays.

18. The bump array structure of claim 15, wherein input and output signal routing from sides of the integrated circuit is enabled through selectively coupling to the inner portion of the plurality of subarrays of metal alloy bumps for power and ground signals on the sides of the integrated circuit input or output signals are routed.

19. The bump array structure of claim 16, wherein input and output signal routing from sides of an integrated circuit is enabled through selectively coupling to the outer peripheral portion of the plurality of subarrays of metal alloy bumps for power and ground signals on the sides of the integrated circuit not used for routing input or output signals.

20. The bump array structure of claim 13, wherein the plurality of subarrays are repeatedly disposed along one of a peripheral direction or through a center of the integrated circuit.

* * * * *